(12) United States Patent
Ohtaguro et al.

(10) Patent No.: US 7,323,276 B2
(45) Date of Patent: Jan. 29, 2008

(54) SUBSTRATE FOR PHOTOMASK, PHOTOMASK BLANK AND PHOTOMASK

(75) Inventors: Ryu Ohtaguro, Kumamoto (JP); Koichi Hashiguchi, Kumamoto (JP)

(73) Assignee: Hoya Corporation, Tokyo (JP)

( * ) Notice: Subject to any disclaimer, the term of this patent is extended or adjusted under 35 U.S.C. 154(b) by 513 days.

(21) Appl. No.: 10/808,540

(22) Filed: Mar. 25, 2004

(65) Prior Publication Data

US 2004/0248017 A1 Dec. 9, 2004

(30) Foreign Application Priority Data

Mar. 26, 2003 (JP) ............................ 2003-084992
Mar. 16, 2004 (JP) ............................ 2004-073763

(51) Int. Cl.
G03F 1/00 (2006.01)
B32B 9/00 (2006.01)

(52) U.S. Cl. .......................................... 430/5; 428/428
(58) Field of Classification Search .................... 430/5; 428/141, 428, 430

See application file for complete search history.

(56) References Cited

U.S. PATENT DOCUMENTS 6,096,405 A * 8/2000 Takahashi et al. .......... 428/141
6,555,273 B2 * 4/2003 Tanabe ........................ 430/5

FOREIGN PATENT DOCUMENTS

JP 56-46227 A 4/1981

* cited by examiner

*Primary Examiner*—S. Rosasco
(74) *Attorney, Agent, or Firm*—Sughrue Mion, PLLC

(57) ABSTRACT

A substrate for photomask has a top surface and a back surface, the substrate being square in shape, an end surface formed along the thickness thereof and a chamfered surface formed on a perimeter edge region where the end surface and the top surface meet and another region where the end surface and the back surface meet, a size of the perimeter edge of the substrate is 300 mm or more on a side and the end surface and the chamfered surface each has a roughened surface having a surface roughness (Ra) ranging from 0.03 μm to 0.3 μm.

16 Claims, 3 Drawing Sheets

(MOVING DISPLAYS ARE ALL PARTICLE)

(1) SUBSTRATE, CASE (2) SUBSTRATE

SURFACE C, SURFACE T, SURFACE C, DIAMOND TOOL, ROTATE AND POLISH

SUBSTRATE FOR PHOTOMASK, PHOTOMASK BLANK AND PHOTOMASK

The present invention claims foreign priority to Japanese patent applications no. 2003-84992, filed on Mar. 26, 2003 and no. 2004-073763 filed on Mar. 16, 2004, the contents of which is incorporated herein by reference.

BACKGROUND OF THE INVENTION

1. Field of the Invention

The present invention relates to a substrate for large-sized photomask for use in pattern transfer in lithography for the production of display devices.

2. Description of the Related Art

A photomask is known as a transparent substrate comprising an opaque layer pattern formed thereon. As a substrate for photomask there is used a substrate having a rectangular surface made of synthetic quartz glass or the like. The surface of such a substrate is normally mirror-polished taking into account light scattering during the use of photomask. A technique involving the mirror polishing of the side portion (an end surface and a chamfered surface) of a substrate for the purpose of preventing adverse effects on quality such as foreign matter defects caused by attachment of dust present in abraded grooves left in the side portion of the substrate to the surface of the photomask during its production is disclosed in Japanese Patent Unexamined Publication JP-A-56-46227.

Examples of photomasks include photomask (reticle) for use in pattern transfer using a reduction projection exposure apparatus (step-and-repeat scanning system or reduction projection aligner) (stepper) during the production of semiconductors and photomask for use in pattern transfer using a mask aligner which is an exposure device employing an equi-magnitude exposure system during the production of display devices such as TFT array for liquid crystal display. The photomask for stepper and the photomask for mask aligner have different sizes. The photomask for stepper is normally in the form of square having a side of 5 or 6 inch. The photomask for mask aligner is normally in the form of rectangle according to the screen size of monitor and TV display. With the recent demand for the increase of the area of display screen and the production of a large number of screens at a time, the trend is for more substrate for photomasks for this kind of photomask to be designed larger.

Referring to photomask for the production of semiconductors, it has been actually practiced to mirror-polish the side portion of substrates as described in Japanese Patent Unexamined Publication JP-A-56-46227. However, the large-sized photomask for display devices are not required to have a mirror surface on the side portion thereof. Thus, it is the actual fact that photomask for display devices are still available having a roughened side portion. In some cases, photomask for mask aligner is detected on the side portion of the substrate. In this case, if the side portion of the substrate has a mirror surface, reflected light cannot be detected. Thus, it has been desired to roughen the side portion of the substrate.

However, with the recent progress of the reduction of size of elements of pattern and the enhancement of precision of pattern in the production of photomask for display devices, it has been necessary that foreign matter defects attached to photomask during the production procedure be more severely controlled.

It has heretofore been practiced to abrade the end surface (surface T) and the chamfered surface (surface C) by rotating a diamond tool having a proper roughness as shown in FIG. 2. However, the surface thus finished has abraded grooves formed thereon in the direction of abrasion. Particles 2 are potentially stored in these abraded grooves 1. These particles 2 are gradually discharged from the abraded grooves 1 when the substrate is cleaned. Then, the particles 2' are attached to the surface of the photomask. Under these conditions, a photomask satisfying the recent demand for defect can no longer be obtained even after many times of cleaning (see FIG. 3).

Further, most retainers such as photomask storage tool and cleaning device are adapted to support the substrate at the side portion thereof. Thus, a problem arises that when the rough side portion of the substrate comes in contact with the aforementioned tool, the tool is scraped to generate dust.

Thus, it can be proposed that the aforementioned large-sized photomask, too, has a mirror surface on the side portion of the substrate. In general, however, photomasks are often handled by hands on the side portion of the substrate during its production and use. With the recent trend toward the increase of the size of photomasks, the substrates therefore, too, have been designed to have a greater weight (about 1 kg to 15 kg). Thus, special care must be taken in handing of these photomasks. Under these circumstances, when the side portion of the substrate has a mirror surface, it is very slippery, making it more likely that the photomasks can drop when handled. Thus, a great problem arises that these photomasks cannot be safely handled.

SUMMARY OF THE INVENTION

The invention has been worked out in the light of these problems. An aim of the invention is to provide a substrate for large-sized photomask which can eliminate the generation of particles from the side portion thereof and can be difficultly slipped when handled on the side portion thereof.

According to a first aspect of the present invention, there is provided a substrate for photomask having a top surface and a back surface, the surfaces being square in shape, an end surface formed along the thickness thereof and a chamfered surface formed on a perimeter edge region where the end surface and the top surface meet and another region where the end surface and the back surface meet, wherein a size of the perimeter edge of the substrate is 300 mm or more on a side and the end surface and the chamfered surface each has a roughened surface having a surface roughness (Ra) ranging from 0.03 μm to 0.3 μm. Wherein two of the perimeter edge regions are the upper perimeter edge region where the end surface and the top surface meet, and lower perimeter edge regions where the end surface and the back surface meet.

According to a second aspect of the present invention as set forth in the first aspect of the present invention, the end surface and the chamfered surface each has a roughened surface having a surface roughness (Ra) ranging from 0.05 μm to 0.3 μm.

According to a third aspect of the present invention, there is provided a substrate for photomask having a top surface and a back surface, the surfaces being square in shape, an end surface formed along the thickness thereof and a chamfered surface formed on a perimeter edge region where the end surface and the top surface meet and another region where the end surface and the back surface meet, wherein a size of the perimeter edge of the substrate is 300 mm or more on a side and the chamfered surface each is a roughened surface polished with an abrasive tool having a particle size ranging from #700 to #2,400.

According to a fourth aspect of the present invention, there is provided a substrate for photomask having a top surface and a back surface, the surfaces being square in shape, an end surface formed along the thickness thereof and a chamfered surface formed on a perimeter edge region where the end surface and the top surface meet and another region where the end surface and the back surface meet, wherein a size of the perimeter edge of the substrate is 300 mm or more on a side and the chamfered surface is a smaller surface roughness than the end surface.

According to a fifth aspect of the present invention as set forth in the fourth aspect of the present invention, the end surface has a surface roughness (Ra) of 0.05 μm or more.

According to a sixth aspect of the present invention, there is provided a photomask blank having a substrate and an opaque layer provided on a top surface of the substrate, wherein the substrate including the top surface and a back surface, the surfaces being square in shape, an end surface formed along the thickness thereof and a chamfered surface formed on a perimeter edge region where the end surface and the top surface meet and another region where the end surface and the back surface meet, wherein a size of the perimeter edge of the substrate is 300 mm or more on a side and the end surface and the chamfered surface each has a roughened surface having a surface roughness (Ra) ranging from 0.03 μm to 0.3 μm.

According to a seventh aspect of the present invention, there is provided a photomask having a substrate and an opaque layer pattern provided on a top surface of the substrate, wherein the substrate including the top surface and a back surface, the surfaces being square in shape, an end surface formed along the thickness thereof and a chamfered surface formed on a perimeter edge region where the end surface and the top surface meet and another region where the end surface and the back surface meet, wherein a size of the perimeter edge of the substrate is 300 mm or more on a side and the end surface and the chamfered surface each has a roughened surface having a surface roughness (Ra) ranging from 0.03 μm to 0.3 μm.

According to an eighth aspect of the present invention as set forth in the first aspect of the present invention, the roughened surface having a surface roughness (Ra) ranging from 0.15 μm to 0.20 μm.

According to a ninth aspect of the present invention as set forth in the third aspect of the present invention, the abrasive tool for polishing the chamfered surface has a particle size ranging from #800 to #1,000.

According to a tenth aspect of the present invention as set forth in the third aspect of the present invention, the chamfered surface is polished with the abrasive tool and an abrasive compound.

According to an eleventh aspect of the present invention, there is provided a photomask blank having a substrate and an opaque layer provided on a top surface of the substrate, wherein the substrate including the top surface and a back surface, the surfaces being square in shape, an end surface formed along the thickness thereof, and a chamfered surface formed on a perimeter edge region where the end surface and the top surface meet and another region where the end surface and the back surface meet, wherein a size of the perimeter edge of the substrate is 300 mm or more on a side and the chamfered surface each is a roughened surface polished with an abrasive tool having a particle size ranging from #700 to #2,400.

According to a twelfth aspect of the present invention, there is provided a photomask blank having a substrate; and an opaque layer provided on a top surface of the substrate, wherein the substrate including the top surface and a back surface, the surfaces being square in shape, an end surface formed along the thickness thereof, and a chamfered surface formed on a perimeter edge region where the end surface and the top surface meet and another region where the end surface and the back surface meet, wherein a size of the perimeter edge of the substrate is 300 mm or more on a side and the chamfered surface is a smaller surface roughness than the end surface.

According to a thirteenth aspect of the present invention, there is provided a photomask having a substrate and an opaque layer provided on a top surface of the substrate, wherein the substrate including the top surface and a back surface, the surfaces being square in shape, an end surface formed along the thickness thereof and a chamfered surface formed on a perimeter edge region where the end surface and the top surface meet and another region where the end surface and the back surface meet, wherein a size of the perimeter edge of the substrate is 300 mm or more on a side and the chamfered surface each is a roughened surface polished with an abrasive tool having a particle size ranging from #700 to #2,400.

According to a fourteenth aspect of the present invention, there is provided A photomask having a substrate and an opaque layer provided on a top surface of the substrate, wherein the substrate including the top surface and a back surface, the surfaces being square in shape, an end surface formed along the thickness thereof and a chamfered surface formed on a perimeter edge region where the end surface and the top surface meet and another region where the end surface and the back surface meet, wherein a size of the perimeter edge of the substrate is 300 mm or more on a side and the chamfered surface is a smaller surface roughness than the end surface.

BRIEF DESCRIPTION OF THE DRAWINGS

FIG. 5 is a diagram illustrating how a photomask is mounted on a storage tool wherein FIG. 5A is a side view and FIG. 5B is a partly enlarged view of FIG. 5A.

DETAILED DESCRIPTION OF THE PREFERRED EMBODIMENT

Figure 1A:
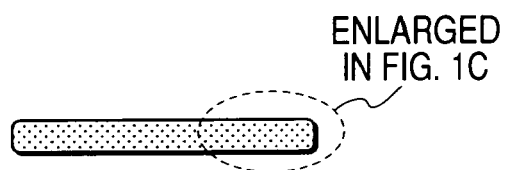
FIG. 1A is a side view of a substrate for large-sized photomask.
Figure 1B:
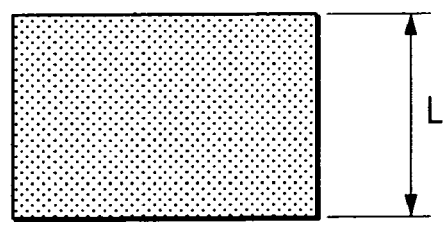
FIG. 1B is a plan view of the substrate for large-sized photomask.
Figure 1C:
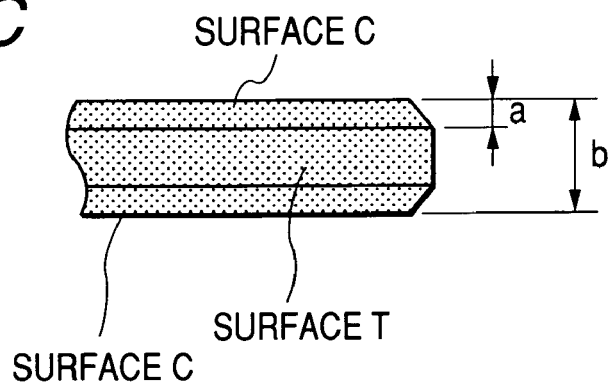
FIG. 1C is a partly enlarged diagram of the side portion of the substrate for large-sized photomask.
Figure 2:
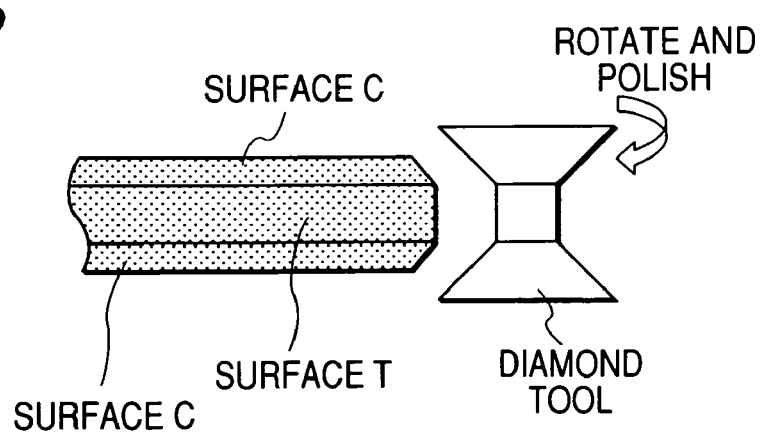
FIG. 2 is a diagram illustrating an abrading method using a diamond tool capable of abrading the end surface (surface T) and the chamfered surface (surface C) at the same time.
Figure 3:
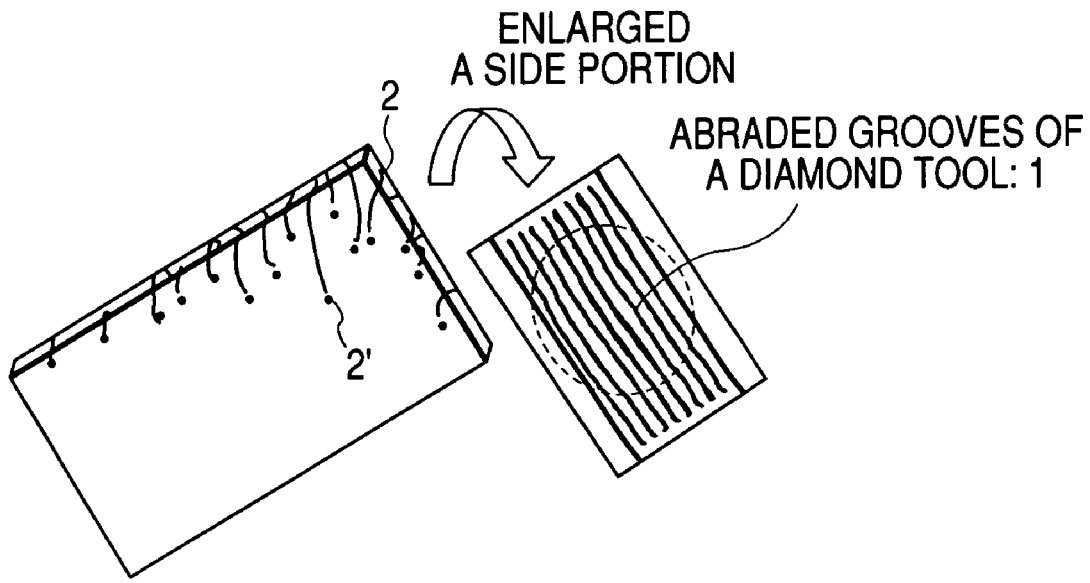
FIG. 3 is a diagram illustrating how particles are generated from abraded grooves formed by the diamond tool of FIG. 2.

FIG. 1A is a side view of a substrate for large-sized photomask. FIG. 1B is a plan view of a substrate for large-sized photomask. FIG. 1C is a partly enlarged diagram of a side portion of a substrate for large-sized photomask.

The main surfaces of the substrate are a first and second surface, i.e., a top surface and a back (bottom) surface, which are opposite to each other. An end or edge surface (T) is formed along the thickness of the substrate. A chamfered surface (C) is formed on a perimeter edge region where the end (edge) surface and the top surface meet, and another chamfered surface is formed on another perimeter edge region where the end (edge) surface and the bottom surface meet.

The term "large-sized photomask" as used herein is meant to indicate a rectangular or square photomask having a side (L) (preferably both sides) of 300 mm or more. In the case of rectangular photomask, the shorter side has a length of 300 mm or more. The invention is more effective on a larger photomask the four sides of which each have a length of 300 mm or more. Specific examples of these large-sized photomasks include those having a size of 330 mm×450 mm, 390 mm×610 mm, 500 mm×750 mm, 520 mm×800 mm and larger sizes.

The large-sized photomask has a thickness b of from about 5 to 15 mm. The width of the chamfered surface (surface C) of the large-sized photomask is from 0.3 to 1.3 mm.

Embodiment 1

Embodiment 1 is an example of a large-sized substrate for photomask comprising a side portion formed by a chamfered surface (surface C) and an end surface (surface T) which are a roughened surface having a surface roughness (Ra) of from 0.03 μm to 0.3 μm over the whole periphery thereof.

When the surface roughness (Ra) of the surfaces C and T is smaller than 0.03 μm, the resulting photomask is slippery, involving a great risk when handled with hands. On the contrary, when the surface roughness (Ra) of the surfaces C and T is greater than 0.3, the resulting photomask remarkably generates particles from the side portion thereof.

The lower limit of the surface roughness (Ra) of the surfaces C and T is preferably 0.05 μm or more, more preferably 0.1 μm or more, even more preferably 0.15 μm or more. The upper limit of the surface roughness (Ra) of the surfaces C and T is preferably 0.25 μm or less, more preferably 0.2 μm or less.

In other words, the term "roughened surface on the side portion having a surface roughness (Ra) of from 0.03 μm to 0.3 μm" as used herein is meant to indicate a roughened surface having a predetermined surface roughness such that both the effects of eliminating the generation of particles from the side portion and making the side portion little slippery during handling can be effectively exerted. The term "roughened surface" as used herein is normally meant to indicate a surface which is rougher than mirror surface having a surface roughness of 0.01 μm or less, including a quasi-mirror surface having a surface roughness of from 0.03 to 0.1 μm. From the standpoint of handleability, a ground glass-like (semitransparent) surface having a surface roughness of more than 0.1 μm is preferred. However, from the standpoint of prevention of generation of particles, a quasi-mirror surface is preferred.

A process for the preparation of a large-sized substrate for photomask according to Embodiment 1 will be described hereinafter.

In order to obtain a roughened surface having a surface roughness falling within the above defined range, a method may be employed which comprises abrading the material using an abrading tool having a grain size of from #700 to #2,400 while properly adjusting conditions such as grain size. Examples of such an abrading tool include diamond tool (wheel-shaped grind stone comprising diamond particles having a predetermined roughness embedded therein).

The use of an abrading tool having a grain size of #700 or more makes it possible to provide a surface roughness Ra of 0.3 μm or less.

The use of an abrading tool having a grain size of #2,400 or less makes it possible to provide a surface roughness Ra of 0.3 μm or more.

The use of an abrading tool having a grain size of from #800 to #1,000 is more desirable.

As an abrading method for obtaining a roughened surface having a surface roughness falling within the above-defined range there may be also used one involving the use of an abrading pad or abrading brush with an abrasive compound. The use of this abrading method is advantageous in that even when the same surface roughness as by diamond tool is provided, the curve constituting the abraded groove is milder than that formed by diamond tool, making it possible to reduce the amount of particles to be stored in the groove.

Example 1 of Embodiment 1

The side portion (surface C and surface T) of a substrate for photomask was abraded over the whole periphery thereof by a diamond tool having a grain size of #800. As a result, the side portion (surface C and surface T) was finished to a roughened surface having a surface roughness Ra of 0.2 μm. This surface was visually semi-transparent. The measurement of surface roughness Ra was made on a line of about 10 mm at an arbitrary position on the side portion.

A photomask blank comprising an opaque layer formed on the aforementioned substrate was then dip-cleaned. When the surface of the photomask blank thus cleaned was then examined for the presence of foreign matters, little particles presumably generated from the side portion of the substrate were detected.

This substrate was handled with hands without any troubles.

Embodiment 2

Embodiment 2 is an example of a large-sized substrate for photomask comprising a side portion formed by an end surface (surface T) and a chamfered surface (surface C) which are a roughened surface and a surface having a smaller surface roughness than the end surface over the whole periphery thereof.

The arrangement such that the chamfered surface C has a smaller surface roughness than the end surface has the following advantages.

Figure 4:
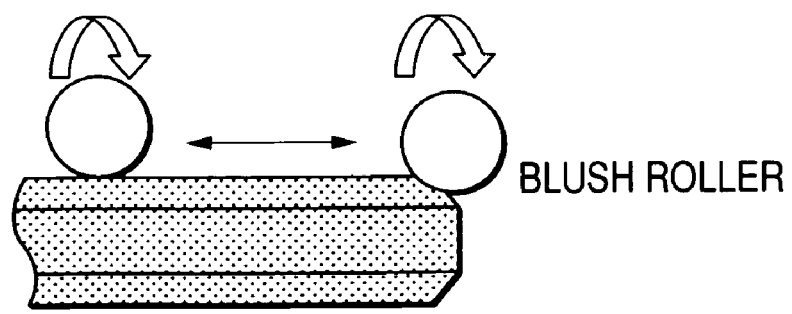
FIG. 4 is a diagram illustrating that foreign matters potentially present on the surface C cause problems particularly when the surface C and a cleaning tool come in contact with each other during scrub cleaning.

Firstly, in order to clean substrates, photomask blanks and photomasks, (A) a so-called dip cleaning method involving the dipping of a substrate in a cleaning fluid or (B) a so-called spin cleaning method involving the rotation of a substrate while being supplied with a cleaning fluid may be employed. Besides these cleaning methods, (C) a so-called scrub cleaning method involving the scrubbing of the surface of a substrate with a cleaning tool such as sponge and brush may be employed. In the scrub cleaning method, the entire surface of the substrate is scrubbed while the substrate and/or the cleaning tool is being moved. However, since the cleaning tool comes in contact with the surface C, foreign matters potentially present on the surface C raise problems (see FIG. 4). Accordingly, by arranging the surface C so as to have a smaller surface roughness than the end surface T and to have less abraded grooves than the end surface T, the amount of particles to be generated from the surface C during scrub cleaning can be drastically reduced, making it possible to reduce the amount of particles to be generated from the side portion of the substrate.

Figure 5:
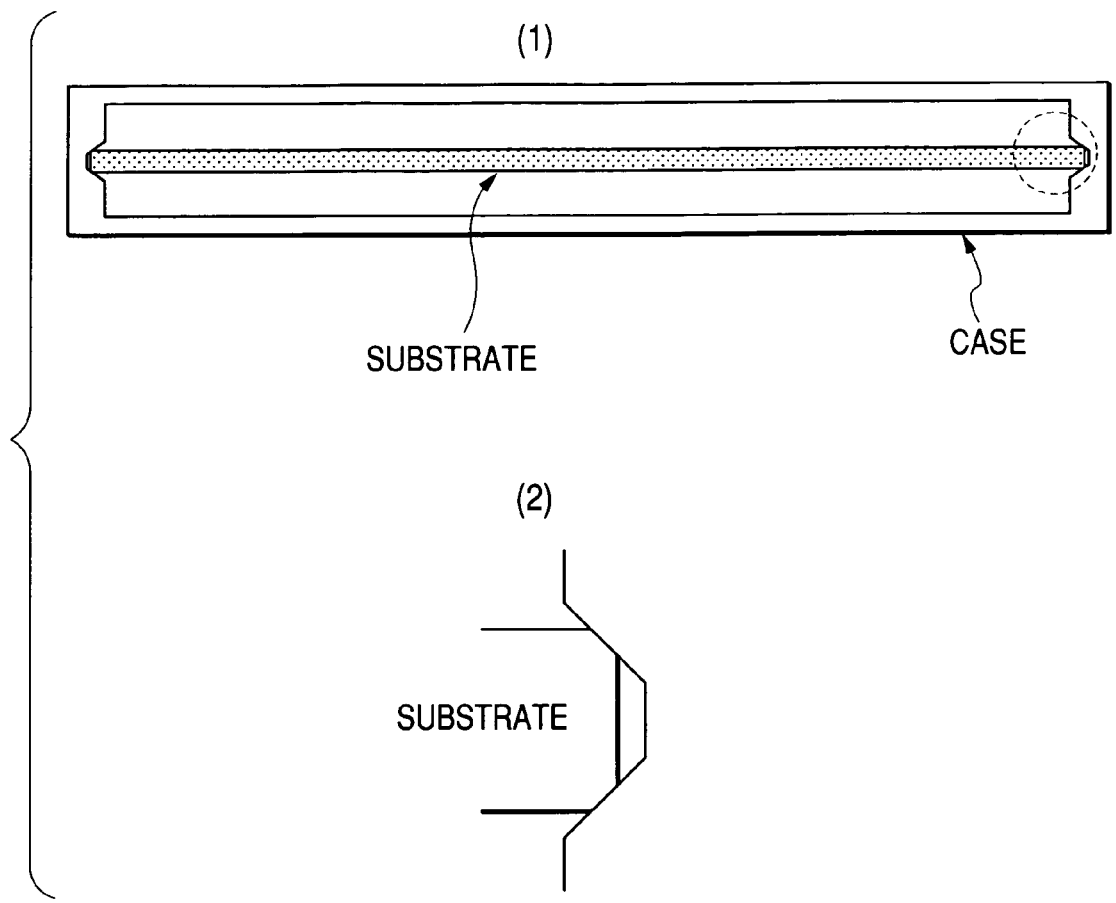
Figure 6:
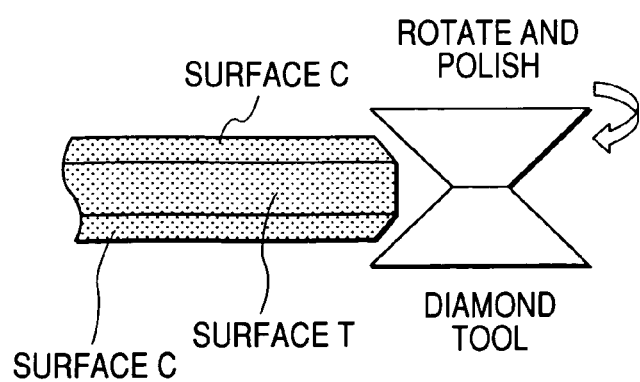
FIG. 6 is a diagram illustrating an abrading method using a diamond tool adapted to abrade only the surface C as used in Embodiment 2.

Secondly, when the substrate is supported on a retainer such as photomask storage tool and cleaning device at the side portion thereof, the substrate comes in contact mainly with the surface C (see FIG. 5). In order to mount the substrate on the retainer in particular, the surface C of the substrate often must slide along a guide and thus scrubs the retainer. Accordingly, by arranging the surface C so as to have a smaller surface roughness than the end surface T, the amount of dust to be generated from the side portion of the substrate can be drastically reduced.

The surface roughness of the surface having a smaller surface roughness than the end surface is preferably such that there are substantially no abraded grooves. In some detail, it is preferred that the chamfered surface (surface C) be a mirror surface or quasi-mirror surface having a surface roughness (Ra) of smaller than 0.1 µm, more preferably smaller than 0.05 µm.

In accordance with Embodiment 2, the end surface T is a roughened surface and, thus, is less slippery and is completely handleable. Further, the end surface T comes in little contact with the cleaning tool (e.g., sponge, brush) during scrub cleaning, making it little likely that dust which can form particles can be discharged from the abraded grooves. Thus, the end surface T gives little or no serious problems even if it is a roughened surface.

The lower limit of the surface roughness (Ra) of the end surface T is preferably more than 0.05 µm, more preferably 0.1 µm or more (corresponding to ground glass-like (semi-transparent) surface), even more preferably 0.15 µm or more.

The upper limit of the surface roughness (Ra) of the end surface T may be more than 0.3 µm. However, the upper limit of the surface roughness (Ra) of the end surface T is preferably 0.3 µm or less, making it possible to prevent the generation of particles from the end surface even during dip cleaning or the like. The extent (upper limit) of the surface roughness (Ra) of the end surface T is preferably 0.25 µm or less, more preferably 0.2 µm or less.

A process for the preparation of "a large-sized substrate for photomask comprising a side portion formed by an end surface (surface T) and a chamfered surface (surface C) which are a roughened surface and a surface having a smaller surface roughness than the end surface over the whole periphery thereof" according to Embodiment 2 will be described hereinafter.

As this preparation process there may be used a process which comprises abrading the side portion of the substrate separately or at the same time using a diamond tool such that the surface C and the surface T have different roughness values.

Alternatively, an abrading method may be employed which comprises the use of an abrasive and an abrading tool (e.g., abrading pad, abrading brush) only for mirror polishing of the surface C. The use of this abrading method is advantageous in that even when the same surface roughness as by diamond tool is provided, the curve constituting the abraded groove is milder than that formed by diamond tool, making it possible to reduce the amount of particles to be stored in the groove.

Example 2 of Embodiment 2

The side portion (surface C and surface T) of a substrate for photomask was abraded by a diamond tool having a surface roughness of #400. As a result, the side portion (surface C and surface T) was finished to a roughened surface having a surface roughness Ra of 0.4 µm. This surface was visually semi-transparent.

Subsequently, using a #2400 diamond tool adapted to abrade only the surface C, the surface C was mirror-finished. The surface C thus formed was visually transparent. The surface C was a mirror surface having a surface roughness (Ra) of smaller than 0.05 µm. The measurement of the surface roughness Ra was conducted in the same manner as in Example 1 of Embodiment 1.

A photomask blank comprising an opaque layer formed on the aforementioned substrate was then dip-cleaned. When the surface of the photomask blank thus cleaned was then examined for the presence of foreign matters, little particles presumably generated from the side portion of the substrate were detected.

Further, the substrate thus treated had a roughened surface on the surface T and thus was handled without any problems.

Comparative Example 1

A substrate for photomask was abraded on the side portion thereof (surface C and surface T) by a diamond tool having a roughness of #400. As a result, the side portion of the substrate for photomask (surface C and surface T) was finished to a roughened surface having a surface roughness Ra of 0.4 µm.

The aforementioned substrate was then dip-cleaned. The surface of the photomask blank thus cleaned was then examined for the presence of foreign matters. As a result, it was found that there had been a large number of particles presumably generated from the side portion of the substrate. The number of particles was not reduced to a predetermined range even after eight times of repetition of cleaning. Similar results were obtained when the substrate was subjected to scrub cleaning. The number of particles was not reduced to a predetermined range even after some repetitions of cleaning.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

In accordance with the invention, a substrate for large-sized photomask can be obtained which can effectively eliminate the generation of particles from the side portion thereof depending on various cleaning methods and can be difficultly slipped when handled on the side portion thereof.

What is claimed is:

1. A photomask blank comprising:
   a substrate; and
   an opaque layer provided thereon,
   the photomask blank used for preparing a photomask for display device manufacturing by patterning the opaque layer, wherein the substrate comprises:
   a first surface and a second surface, said first surface opposite to said second surface, an edge surface, and chamfered surfaces, said chamfered surfaces being formed between the first surface and the edge surface, and between the second surface and the edge surface, respectively, wherein said substrate has a square shape having each side length of at least 300 mm and a weight of 1 to 15 Kg, and said edge surface and the chamfered surfaces have roughened surfaces having a surface roughness (Ra) of 0.03 to 0.3 micrometer.

2. A photomask blank as set forth in claim 1, wherein the roughened surface has a surface roughness (Ra) ranging from 0.15 μm to 0.20 μm.

3. A photomask blank as set forth in claim 1, wherein an abrasive tool for polishing the chamfered surfaces has a particle size ranging from #800 to #1,000.

4. A photomask blank as set forth in claim 1, wherein the chamfered surfaces are polished with an abrasive tool and an abrasive compound.

5. A photomask blank as set forth in claim 1, wherein the edge surface has a surface roughness (Ra) of 0.05 μm or more.

6. A photomask blank for photomask as set forth in claim 1, wherein the edge surface and the chamfered surfaces each have a roughened surface having a surface roughness (Ra) ranging from 0.05 μm to 0.3 μm.

7. A photomask blank as set forth in claim 1, wherein the roughened surface has a surface roughness (Ra) ranging from 0.15 μm to 0.20 μm.

8. A photomask comprising:
a substrate; and
an opaque layer pattern provided thereon,
which substrate comprises:
a first surface and a second surface, said first surface opposite to said second surface, an edge surface and chamfered surfaces, said chamfered surfaces being formed between the first surface and the edge surface, and between the second surface and the edge surface, respectively,
wherein said substrate has a square shape having each side length of at least 300 mm and a weight of 1 to 15 Kg, and
said edge surface and said chamfered surfaces have roughened surfaces having a surface roughness (Ra) of 0.03 to 0.3 micrometer.

9. A photomask as set forth in claim 8, wherein an abrasive tool for polishing the chamfered surfaces has a particle size ranging from #800 to #1,000.

10. A photomask as set forth in claim 8, wherein the chamfered surfaces are polished with an abrasive tool and an abrasive compound.

11. A photomask as set forth in claim 8, wherein the edge surface has a surface roughness (Ra) of 0.05 μm or more.

12. A photomask as set forth in claim 8, wherein the edge surface and the chamfered surfaces each have a roughened surface having a surface roughness (Ra) ranging from 0.05 μm to 0.3 μm.

13. A photomask blank comprising:
a substrate; and
an opaque layer provided on a top surface of the substrate, wherein the substrate comprises:
a first surface and a second surface, said first surface opposite to said second surface, an edge surface and chamfered surfaces, said chamfered surfaces being formed between the first surface and the edge surface, and between the second surface and the edge surface, respectively, wherein said substrate has a square shape having each side length of at least 300 mm and a weight of 1 to 15 Kg, and each of the chamfered surfaces is a roughened surface polished with an abrasive tool having a particle size ranging from #700 to #2,400.

14. A photomask blank comprising:
a substrate; and
an opaque layer provided thereon,
the photomask blank used for preparing a photomask for display device manufacturing by patterning the opaque layer,
wherein the substrate comprises:
a first surface and a second surface, said first surface opposite to said second surface, an edge surface and chamfered surfaces, said chamfered surfaces being formed between the first surface and the edge surface, and between the second surface and the edge surface, respectively,
wherein said substrate has a square shape having each side length of at least 300 mm and a weight of 1 to 15 Kg, and
each of the chamfered surfaces have a smaller surface roughness than the edge surface.

15. A photomask for display device manufacturing comprising:
a substrate; and
an opaque layer provided thereon,
wherein the substrate comprises:
a first surface and a second surface, the first surface opposite to the second surface, an edge surface and chamfered surfaces, said chamfered surfaces being formed between the first surface and the edge surface, and between the second surface and the edge surface, respectively,
wherein said substrate has a square shape having each side length of at least 300 mm and a weight of 1 to 15 Kg,
and each of the chamfered surfaces has a roughened surface polished with an abrasive tool having a particle size ranging from #700 to #2,400.

16. A photomask for display device manufacturing comprising:
a substrate; and
an opaque layer provided thereon,
wherein the substrate comprises:
a first surface and a second surface, the first surface opposite to the second surface, an edge surface and chamfered surfaces, said chamfered surfaces being formed between the first surface and the edge surface, and between the second surface and the edge surface, respectively,
wherein said substrate has a square shape having each side length of at least 300 mm and a weight of 1 to 15 Kg,
and each of the chamfered surfaces has a smaller surface roughness than the edge surface.

* * * * *